(12) United States Patent
Song et al.

(10) Patent No.: US 11,678,585 B2
(45) Date of Patent: Jun. 13, 2023

(54) SEMICONDUCTOR DEVICE WITH ASYMMETRICAL PINNED MAGNETS, AND METHOD OF MANUFACTURE

(71) Applicant: Taiwan Semiconductor Manufacturing Co., Ltd., Hsinchu (TW)

(72) Inventors: Mingyuan Song, Hsinchu (TW); Chwen Yu, Hsinchu (TW); Shy-Jay Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/935,029

(22) Filed: Jul. 21, 2020

(65) Prior Publication Data

US 2020/0350487 A1 Nov. 5, 2020

Related U.S. Application Data

(62) Division of application No. 15/982,743, filed on May 17, 2018, now Pat. No. 10,756,255.

(51) Int. Cl.
| | |
|---|---|
| *G11C 11/16* | (2006.01) |
| *H01L 43/02* | (2006.01) |
| *H01L 43/12* | (2006.01) |
| *H01L 43/10* | (2006.01) |

(52) U.S. Cl.
CPC ............ *H01L 43/02* (2013.01); *G11C 11/161* (2013.01); *H01L 43/10* (2013.01); *H01L 43/12* (2013.01)

(58) Field of Classification Search
CPC ....... G11C 11/161; H01L 43/02; H01L 43/10; H01L 43/12
See application file for complete search history.

(56) References Cited

U.S. PATENT DOCUMENTS

| | | | |
|---|---|---|---|
| 2013/0009258 A1* | 1/2013 | Lee | G01R 33/098 |
| | | | 257/E29.323 |
| 2018/0284200 A1* | 10/2018 | Chen | G01R 33/1269 |
| 2019/0189172 A1 | 6/2019 | Higo et al. | |
| 2019/0244646 A1* | 8/2019 | Lee | H01L 43/02 |
| 2019/0245137 A1* | 8/2019 | Choi | G11C 11/1675 |

OTHER PUBLICATIONS

He et al., "[Co/Ni]$_N$-Based Synthetic Antiferromagnet With Perpendicular Anisotropy and Its Application in Pseudo Spin Valves," *IEEE Transactions on Magnetics* 46(6):1327-1330, 2010.

(Continued)

*Primary Examiner* — Wasiul Haider
(74) *Attorney, Agent, or Firm* — Seed IP Law Group LLP

(57) ABSTRACT

A device is provided that includes a semiconductor substrate on which a free magnetic element is positioned, which has first and second magnetic domains separated by a domain wall. A first magnet is positioned on the substrate near a first end of the free magnetic element, and has a first polarity and a first value of coercivity. A second magnet is positioned on the substrate near a second end of the free magnetic element, and has a second polarity, antiparallel relative to the first polarity, and a second value of coercivity different from the first value of coercivity.

17 Claims, 10 Drawing Sheets

(56) References Cited

OTHER PUBLICATIONS

Jinnai et al., "Spin-orbit induced magnetization switching in Co/Pt multilayers," *Applied Physics Letters* 111(10):102402, 2017, (5 pages).
Sengupta et al., "Proposal for an All-Spin Artificial Neural Network: Emulating Neural and Synaptic Functionalities Through Domain Wall Motion in Ferromagnets," *IEEE Transactions on Biomedical Circuits and Systems* 10(6):1152-1160, 2016.

\* cited by examiner

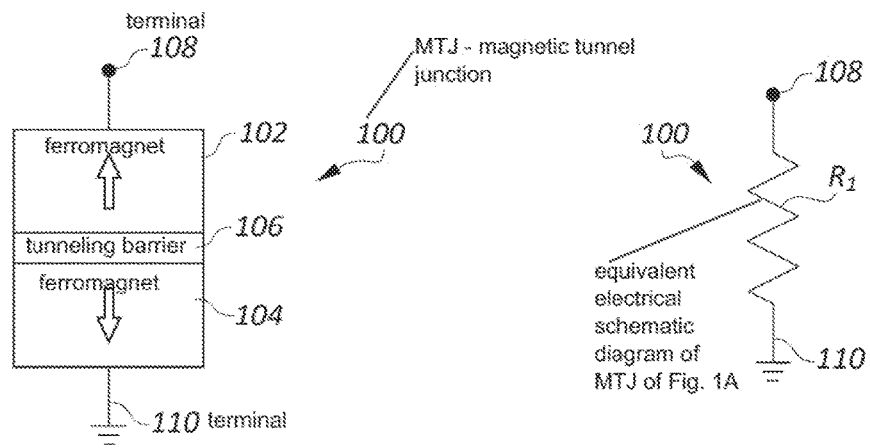
FIG. 1A
FIG. 1B
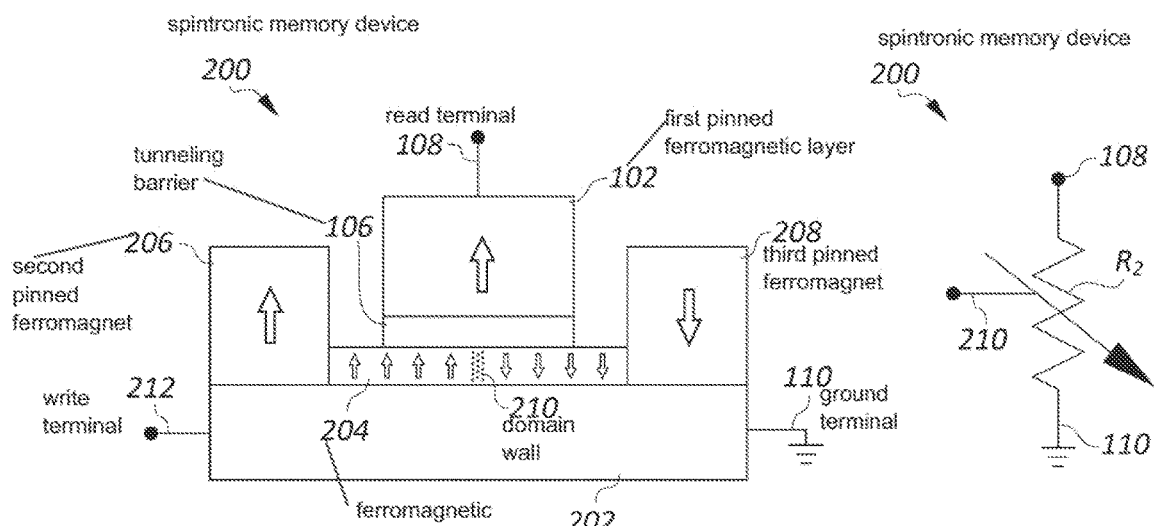
FIG. 2A
FIG. 2B

SEMICONDUCTOR DEVICE WITH ASYMMETRICAL PINNED MAGNETS, AND METHOD OF MANUFACTURE

BACKGROUND

Spintronic memory devices have been proposed as components in artificial neural network architectures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a side elevation diagram of a magnetic tunnel junction (MTJ).

FIG. 1B is an equivalent electrical schematic diagram of the MTJ of FIG. 1A.

FIG. 2A is a side elevation diagram showing a spintronic memory device.

FIG. 2B is an equivalent electrical schematic diagram of the spintronic memory device of FIG. 2A.

DETAILED DESCRIPTION

Figure 3:
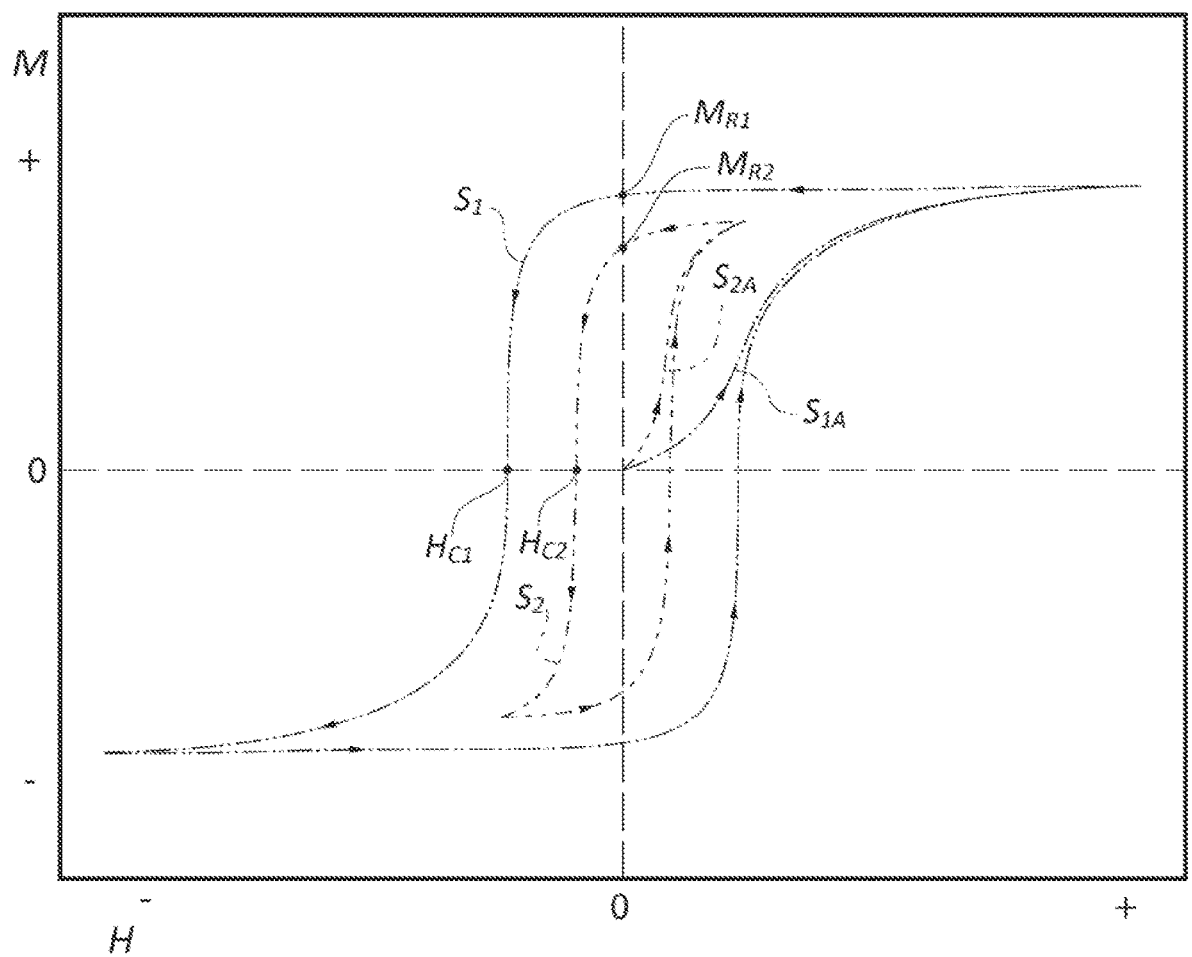
FIG. 3 is a graph showing magnetization vs. magnetic field strength of first and second magnetic samples in an oscillating magnetic field.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the drawings, hollow arrows are used to indicate magnetic or electron spin polarity within a structure or region, relative to polarities of other structures or regions in a same drawing. These arrows are not intended to indicate any specific polarity, nor even a specific axis of polarity. Where regions, structures or domains are referred to as being parallel, this indicates that polarities of the elements referred to are oriented substantially in a same direction and parallel to a same axis. The term antiparallel refers to polarities that are not oriented in a same direction or parallel to a same axis. While antiparallel typically suggests that one polarity is oriented at 180° with reference to another polarity, there may be instances where the angular difference of orientation is other than 180°.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1A is a side elevation diagram of a magnetic tunnel junction (MTJ) 100, while FIG. 1B is an equivalent electrical schematic diagram of the MTJ. The MTJ 100 is formed by first and second ferromagnets 102, 104 that are separated by a tunneling barrier 106. When an electric potential is applied across the MTJ 100 at terminals 108 and 110, the MTJ behaves as an electrical resistor $R_1$ having a resistive value that depends upon the relative polarities of the first and second ferromagnets 102, 104. If, for example, the first and second ferromagnets 102, 104 are oriented with their respective polarities in opposition—i.e., antiparallel—as shown in FIG. 1A, the resistive value of the resistor $R_1$ will be relatively high. On the other hand, if the respective polarities have the same orientation, i.e., are parallel, the resistive value of the resistor $R_1$ will be relatively low. This difference in resistance is due to tunnel magneto resistance (TMR). The actual ohmic values of the relative high and low resistances depend upon several factors, including the compositions of the first and second ferromagnets 102, 104 and of the tunneling barrier 106, the dimensions of the first and second ferromagnets, and the material and thickness of the tunneling barrier.

FIG. 2A is a structural diagram showing a spintronic memory device 200, while FIG. 2B is an equivalent electrical schematic diagram of the spintronic device. The spintronic memory device 200 includes a write layer 202, a ferromagnetic free layer 204, and a first pinned ferromagnet 102 separated from the free layer 204 by a tunneling barrier 106. The ferromagnetic free layer 204 has oppositely polarized magnetic domains (represented by the arrows within free layer 204) separated by a domain wall 210. The magnetic domains of the free layer 204 are stabilized by the second and third pinned ferromagnets 206, 208, which are positioned at respective ends of the free layer 204. A write terminal 212 is electrically coupled to the write layer 202 near the second pinned ferromagnet 206 and a ground terminal 110 is electrically coupled to the write layer 202 near the third pinned ferromagnet 208. A read terminal 108 is electrically coupled to the first pinned ferromagnet 102.

Programming of the spintronic memory device 200 is performed by the application of an electrical potential between the write and ground terminals 212, 110. A write current generated in the write layer 202 creates spin orbit torque that moves the domain wall 210 to the left or right, depending upon the polarity of the electrical potential relative to the orientation of the magnetic domains of the ferromagnetic free layer 204. The distance, or amount of movement of the domain wall 210 depends upon the strength of the write current. When the electrical potential is removed, the position of the domain wall 210 separating the magnetic domains of the free layer 204 is stabilized by the second and third pinned ferromagnets 206, 208, and remains in the position established by the generated current. When a read potential is applied across the read and ground terminals 108, 110, a read current is generated whose value depends upon the TMR across a MTJ formed by the first pinned ferromagnet 102, the tunneling barrier 106 and the ferromagnetic free layer 204. The TMR, in turn, is controlled by the position of the domain wall 210.

The memory device described above with reference to FIGS. 1A, 1B, 2A and 2B has shown significant promise for use in forming synapses and neurons in artificial neural network systems, because of its ability to hold an analog value. However, the inventors have recognized that there are potential problems that could interfere with production of such devices, in particular, the production of closely positioned magnetic elements having antiparallel polarities. A magnet is generally made by first forming the element of an appropriate magnetic material, then magnetizing the element by exposure to a strong magnetic field of a desired polarity. Given the very small size of the ferromagnets of the memory device—perhaps less than a few hundred nanometers (nm) across—it may be extremely challenging to apply a magnetic field of one polarity to a single one of the ferromagnets without affecting the polarities of other ferromagnets nearby.

The inventors have recognized that one magnetic element can be magnetized at one polarity without significantly affecting the polarity of an adjacent magnetic element by providing magnetic elements with different values of coercivity, as explained below.

Typically, when an element of ferromagnetic material is subjected to a strong magnetic field, it will become magnetized, i.e., it will retain some residual magnetism when the field is removed. The strength of the magnetization will vary, up to a maximum strength, or saturation, in direct relation to the strength of the magnetic field. The polarity of the field, relative to the element, will determine the magnetic polarity of the residual magnetism. If, after having been magnetized at a first polarity, the element is then subjected to a magnetic field of an opposite polarity of sufficient strength, the element will become demagnetized, then remagnetized at the opposite polarity.

FIG. 3 is a graph showing magnetization vs. magnetic field strength i.e., flux density, of first and second magnetic samples in an oscillating magnetic field. The magnetization M of each sample is shown in the vertical axis, while the field strength H is shown in the horizontal axis. The samples are initially magnetized from zero, as indicated by respective initial magnetization curves $S_{1A}$, $S_{2A}$. Thereafter, the plotted response characteristics of the first and second samples follow respective hysteresis loops $S_1$, $S_2$. The points where the loops cross the vertical axis M define the remanence $M_{R1}$, $M_{R2}$ of the respective samples, i.e., the residual magnetism of the samples when the magnetic field drops, from a flux density sufficient to saturate the respective sample, to zero; the points where the loops cross the horizontal axis H define the coercivity $H_{C1}$, $H_{C2}$ of the respective samples, i.e., the field strength required to reduce the residual magnetism of the respective sample to zero.

For the purposes of this disclosure, coercivity can also be thought of as a measure of the ability of a given magnetic sample to retain magnetization with a first polarity when subjected to a magnetic field of the opposite polarity, or in other words, the degree of resistance of the sample to demagnetization by an opposing magnetic field. The unit used herein for defining values of coercivity is the oersted (Oe), which is equal to one dyne per Maxwell, in the CGS system. As previously noted, hollow arrows are used in the drawings to indicate relative magnetic or electron spin polarities of elements depicted in a same drawing. Additionally, arrow size is used to indicate relative values of coercivity, i.e., a large arrow indicates an element whose coercivity is greater than that of an element with a relatively smaller arrow, etc.

Figure 4:
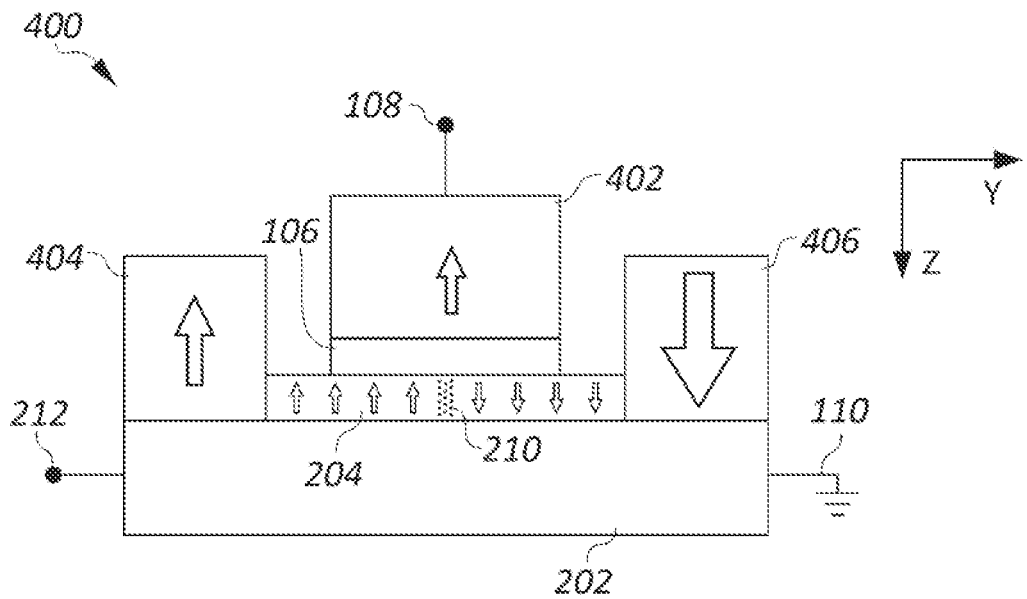
FIG. 4 is a side elevation diagram of a spintronic memory device, according to an embodiment.

FIG. 4 is a side elevation diagram of a spintronic memory device 400, according to an embodiment of the present disclosure. The spintronic memory device 400 includes a write layer 202 on which a ferromagnetic free layer 204 is formed, including oppositely polarized magnetic domains separated by a domain wall 210. A first pinned ferromagnet 402 is separated from the free layer 204 by a tunneling barrier 106. Second and third pinned ferromagnets 404, 406 are positioned at respective ends of the free layer 204. A read terminal 108 is electrically coupled to the first pinned ferromagnet 402, while write and ground terminals 212, 110 are electrically coupled near respective ends of the write layer 202. The write layer 202 is a conductive material in which spin orbit torque is generated by a write current flowing between the write and ground terminals 212, 110. According to an embodiment, the write layer 202 is a layer of heavy metal or heavy metal alloy, such as, e.g., Pt (platinum), Ta (tantalum), PtMn (platinum-manganese), etc.

The term pinned refers to an element whose magnetization is fixed or substantially fixed, at least to the extent that magnetic fields produced during normal operation of the device will have no effect on its magnetization. In contrast, a free magnetic element, such as the free layer 204, is configured such that its magnetization can be manipulated during operation.

In the embodiment of FIG. 4, characteristics of the memory device 400 are controlled during the manufacturing process such that the coercivity of the third pinned ferromagnet 406 is greater than that of the second pinned ferromagnet 404, which in turn is greater than the coercivity of the first pinned ferromagnet 402. For its part, the coercivity of the ferromagnetic free layer 204 is relatively much lower than that of any of the first, second, or third pinned ferromagnets 402, 404, 406. Following manufacture of the device, the first and second pinned ferromagnets 402, 404 are magnetized according to a first polarity, while the third ferromagnet is magnetized with a second polarity, antiparallel to the first polarity. Following magnetization of the pinned ferromagnets and before beginning normal operation of the memory device 400, the domain wall 210 is moved, by application of a write current of the appropriate strength and polarity, to near or beyond the edge of a magnetic tunnel junction region, i.e., the portion of the ferromagnetic free layer 204 that is directly opposite the first pinned ferromagnet 402. This results in a TMR that is either at a minimum or a maximum value, depending upon the relative polarities of the first ferromagnet 402 and the junction region of the free layer 204. Either of these TMR values (minimum or maximum) can be designated as a zero, null, or unprogramed condition of the device.

A read current is limited by the tunnel magneto resistance (TMR) of a magnetic tunnel junction (MTJ) formed by the combination of the first pinned ferromagnet 402, the ferromagnetic free layer 204, and the tunneling barrier 106. The total resistive value of the TMR is essentially the combined values of three parallel resistances: the resistance of a first portion of the MTJ on one side of the domain wall 210, in which the domains of the first pinned ferromagnet 402 and the free layer 204 are parallel, and whose resistance per unit of area is relatively low; the resistance of a second portion of the MTJ on the opposite side of the domain wall, in which the domains of the first pinned ferromagnet 402 and the free layer 204 are antiparallel, and whose resistance per unit of area is relatively high; and the resistance of a third portion of the MTJ occupied by the domain wall itself, and whose resistance per unit of area is between those of the first and second portions of the MJT. The electrical resistance of the domain wall 210 remains substantially constant and, because the domain wall is only a few molecules in width, has a minimal effect on the total TMR. Thus, control of the total resistive value is dominated by the first and second resistances of the respective first portion of the MJT and the second portion of the MJT. The sizes of the first and second portions of the MJT, and thus their relative influence on the TMR, vary in inverse relation as the domain wall 210 is moved.

On its own, the ferromagnetic free layer 204 is a relatively unstable magnet. The second and third pinned ferromagnets 404, 406 can be thought of as forming, with the free layer 204, one continuous magnet, with poles defined by the second and third ferromagnets 404, 406. This continuous magnet is less susceptible to unintended changes in magnetization, i.e., unintended movements of the domain wall 210 than the free layer alone. This is only possible if the second and third pinned ferromagnets 404, 406 are antiparallel with respect to each other.

Figure 5:
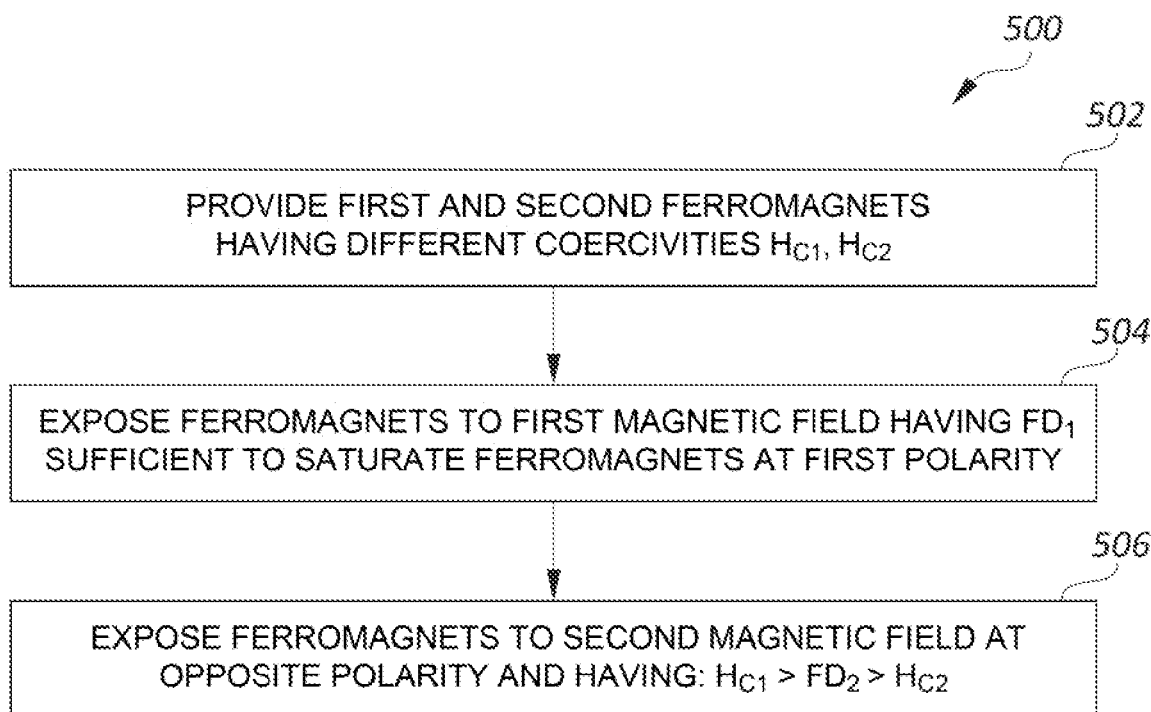
FIG. 5 is a simple flow chart outlining a method for magnetizing first and second ferromagnets, according to an embodiment.
Figure 6:
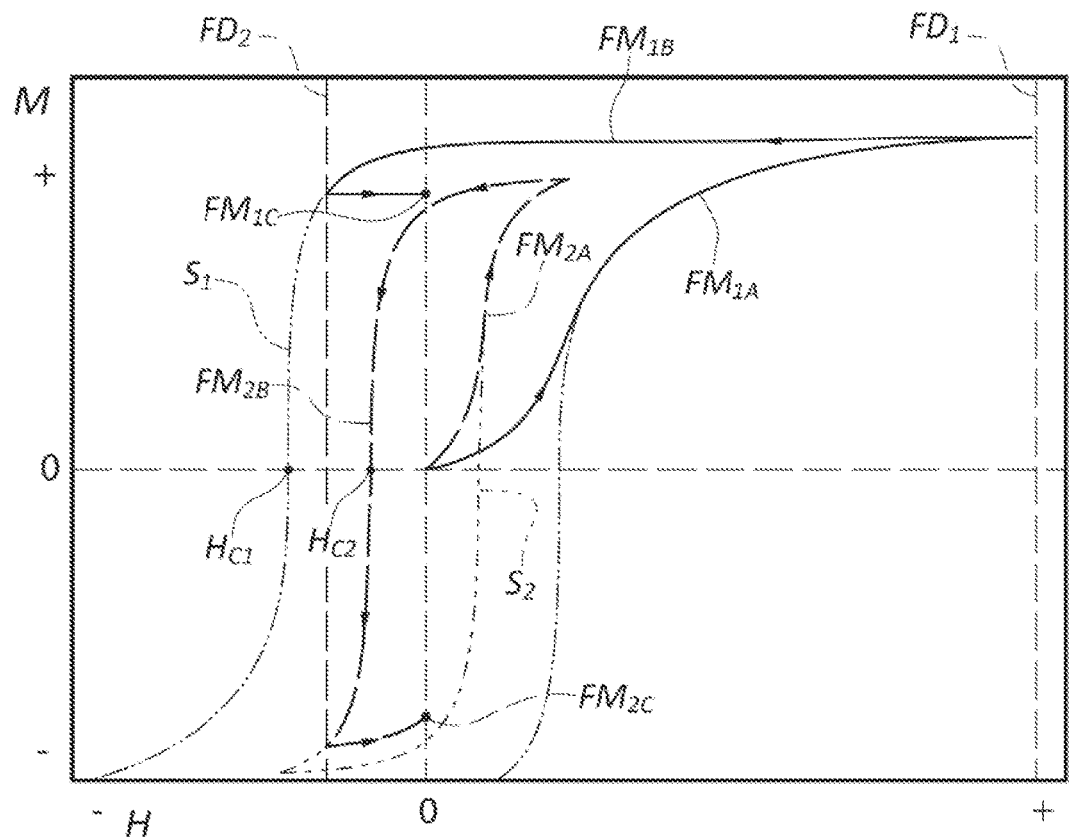
FIG. 6 is a graph showing the magnetic responses of the first and second ferromagnets during the steps of the process of FIG. 5.

FIG. 5 is a flow chart outlining a method 500 for magnetizing first and second ferromagnets, according to an embodiment. For the purposes of this discussion, it can be assumed that the magnetic characteristics of the first and second ferromagnets are similar to those of the first and second ferromagnetic samples discussed above with reference to FIG. 3. FIG. 6 is a graph showing the magnetic responses of these first and second ferromagnets during the steps of the process 500 of FIG. 5. For context, portions of the characteristic hysteresis loops of the first and second ferromagnetic samples of FIG. 3 are also shown in FIG. 6, at $S_1$, and $S_2$.

In accordance with the embodiment of FIG. 5, first and second ferromagnets are provided, in step 502, having respective different values of coercivity $H_{C1}$, $H_{C2}$, corresponding, in this embodiment, to the coercivities of the first and second ferromagnetic samples of FIG. 3—structures and methods for controlling coercivity are described in detail below. In step 504, the first and second ferromagnets $FM_1$, $FM_2$ are exposed to a first magnetic field that has a flux density $FD_1$ sufficient to saturate both ferromagnets at a first polarity, from a non-magnetized condition, as shown in FIG. 6, at $FM_{1A}$ and $FM_{2A}$.

In step 506, the first and second ferromagnets are exposed to a second magnetic field whose polarity is opposite that of the first magnetic field, and that has a flux density $FD_2$ that is greater than the coercivity $H_{C2}$ of the second ferromagnet but less than the coercivity $H_{C1}$ of the first ferromagnet. The responses of the first and second ferromagnets to the second magnetic field are shown in FIG. 6 at $FM_{1B}$ and $FM_{2B}$. When the second magnetic field is removed, the first and second ferromagnets each retain a residual magnetism, as indicated at $FM_{1C}$ and $FM_{2C}$, respectively.

As shown at $FM_{1C}$, because the flux density $FD_2$ of the second magnetic field does not exceed the coercivity $H_{C1}$ of the first ferromagnet, the residual magnetization of the first ferromagnet is reduced only slightly from saturation in response to the second magnetic field; the first ferromagnet remains strongly magnetized at the first polarity. Meanwhile, the flux density $FD_2$ of the second magnetic field does exceed the coercivity $H_{C2}$ of the second ferromagnet. Consequently, as shown at $FM_{2C}$, the second ferromagnet is remagnetized at the opposite polarity, and retains a strong residual magnetization at that polarity. The result of this process is that even though both the first and the second ferromagnets are subjected to the same process, they become magnetized at opposite polarities.

The method described above has particular value in circumstances where it is desirable or necessary to magnetize two or more closely positioned magnetic elements at opposite polarities, or in quickly magnetizing a large number of magnetic elements of different polarities. Referring, for example, to the memory device 400 of FIG. 4, it is contemplated that such a device may be formed on a semiconductor material substrate as part of a memory array, an artificial neural network processor, a more conventional processor, etc., and so might be one of millions or billions of similar devices, and therefore sized accordingly. The inventors have recognized that if the magnetic elements of a memory device similar to that described above with reference to the document entitled *Proposal for an All-Spin Artificial Neural Network: Emulating Neural and Synaptic Functionalities Through Domain Wall Motion in Ferromagnets* is provided with similar or identical magnetic properties, at least one of the elements will need to be selectively exposed to a magnetic field of sufficient strength to magnetize the element while being limited, focused, or constrained to a degree necessary to avoid affecting other elements of the same device. Given the possible dimensions and quantities involved, particularly in the mass production of commercial systems, this is likely to prove to be, at the least, a challenging, technically complex, and time-consuming process. The inventors have conceived of a device configuration in which magnetic elements having selected different coercivities are provided, which enables application of the principles described above with reference to FIGS. 5 and 6. In accordance with these principles, it is possible to effectively and efficiently magnetize the magnetic elements of each device on a substrate.

Controlling the magnetic characteristics of a magnetic element, including its coercivity, can be performed in a number of ways. For example, according to an embodiment, the pinned ferromagnets of the memory device 400 of FIG. 4 can be formed of different magnetic materials and alloys, including, in particular, various alloys that include iron, nickel, and/or cobalt. A large number of different ferromagnetic alloys are known in the art, many with very widely varied magnetic properties and are included within the scope of the present disclosure. Thus, according to an embodiment, alloys used in the manufacture of the memory device 400 are selected such that at least one of the pinned ferromagnets has a coercivity that is different than that of others of the ferromagnets.

The inventors have also recognized that it is desirable to minimize the processes required to manufacture semiconductor-based devices and systems, and that therefore it would be beneficial to manufacture many or all of the ferromagnets simultaneously, using the same materials and processes for each. Therefore, according to another embodiment, a manufacturing process is provided in which coercivity of the ferromagnets is selected and controlled by selection of the shape, size, mass, and/or aspect ratio of each of the ferromagnets.

Figure 7:
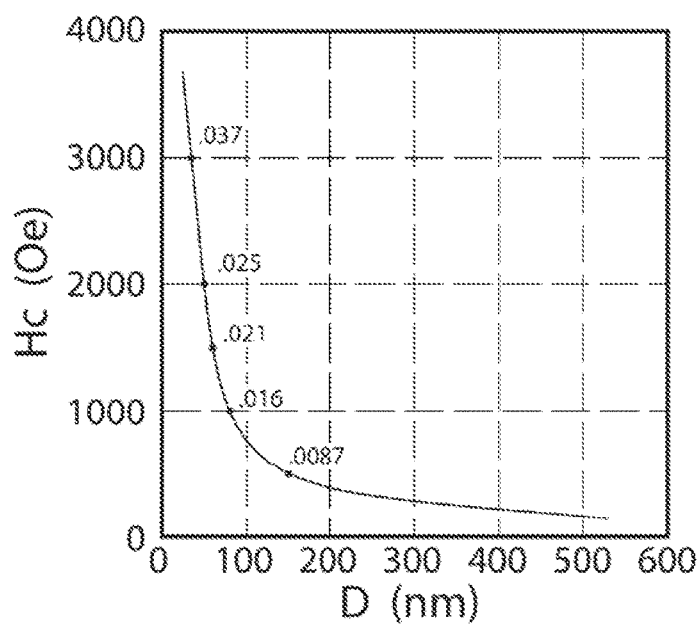
FIG. 7 is a chart showing values of coercivity plotted against diameters of test samples.

Experiments have been conducted in which magnetic samples made from an alloy of cobalt, iron, and boron (CoFeB) were produced and tested for coercivity. Each sample had a thickness of 1.3 nm, with diameters that varied from as large as around 500 nm to as small as around 25 nm. The coercivities of the test samples were found to vary from less than 200 Oe, in the samples with the largest diameters and lowest aspect ratios, to more than 3500 Oe, in the samples with the smallest diameters and highest aspect ratios. According to an embodiment, the coercivities of the ferromagnets of the memory device 400 are selected to be greater than about 500 Oe, to reduce the likelihood that the magnetization of one of the pinned elements might be unintentionally affected by an externally generated magnetic field, and less than about 3000 Oe, to enable initial magnetization of the pinned elements without undue expense or time. FIG. 7 is a chart showing the values of coercivity plotted against the diameters of the samples. Aspect ratios (thickness/diameter) of selected samples are also shown in the chart. As shown in FIG. 7, CoFeB ferromagnets can be made with aspect ratios of between 0.0087 and 0.037 to provide coercivities of between 500 Oe and 3000 Oe.

Figure 8:
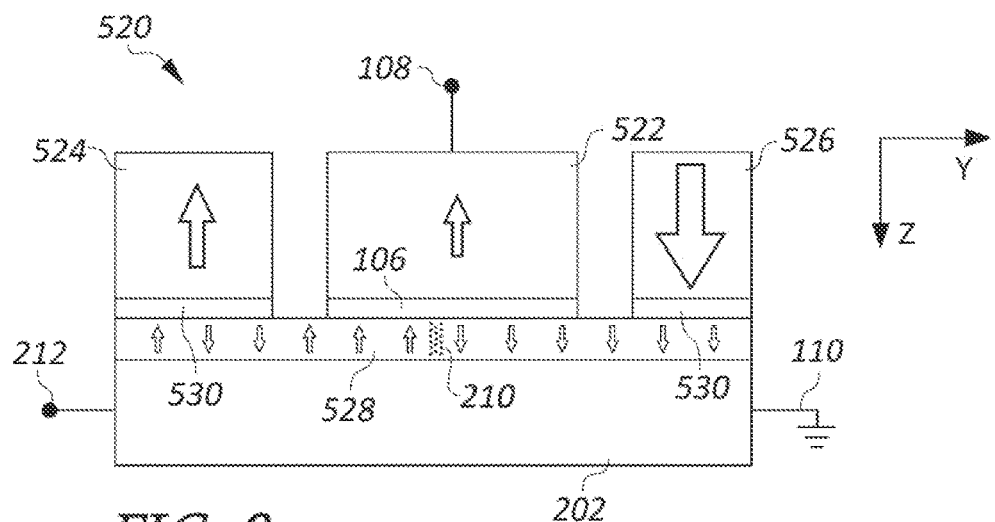
FIG. 8 is a side elevational diagram of a spintronic memory device, according to another embodiment.

FIG. 8 is a side elevational diagram of a spintronic memory device 520, according to an embodiment. The memory device 520 is similar in structure and operation to the device 400 described above with reference to FIG. 4, and includes a write layer 202, a ferromagnetic free layer 528, a tunneling barrier 106, and first, second, and third pinned ferromagnets 522, 524, 526. Likewise, read write and ground terminals 108, 212, 110 are also provided. However, there are some structural differences between the devices 400 and 520. For example, it can be seen that in the memory device 520, the ferromagnetic free layer 528 extends across the entire device, and that a respective tunneling barrier layer 530 is positioned between each of the second and third ferromagnets 524, 526 and the free layer. These features are primarily for convenience in manufacturing, as will be explained below, with referenced to FIGS. 11-13. Another distinguishing feature of the memory device 520 is that the first, second, and third pinned ferromagnets 522, 524, 526 have respective different aspect ratios, selected to provided respective different coercivities. The third pinned ferromagnet 526 has the highest aspect ratio and the correspondingly highest coercivity, while the first and second pinned ferromagnets 522, 524 have lower aspect ratios and correspondingly lower coercivities. Thus, the first, second, and third pinned ferromagnets 522, 524, 526 are configured to be selectively magnetized at at least two separate polarities, in accordance with the method 500 described above.

According to an embodiment, the first and second pinned ferromagnets 522, 524 are CoFeB magnets with aspect ratios that are between 0.0087 and 0.016, and have coercivities of between 500 and 1000 Oe. The third ferromagnet 526 is a CoFeB magnet with an aspect ratio of between 0.021 and 0.037 Oe, and a coercivity of between 2000 and 3000 Oe. Other embodiments are contemplated in which the acceptable range of coercivities is different than the range defined above, either out of necessity or convenience. This may be the case, for example, in accordance with specific design criteria, intended operating conditions, surrounding structure, etc.

According to one embodiment, the ferromagnetic free layer 528 is a CoFeB magnet, and the tunneling barrier layer 106 is of MgO (magnesium oxide), which has been found to provide a satisfactory barrier layer in a MTJ in combination with CoFeB ferromagnets. The present disclosure is not limited to CoFeB ferromagnetic free layer or an MgO tunneling barrier layer. The specific materials used is a matter of system design, and there are other combinations of materials that will perform satisfactorily as the ferromagnetic free layer and the tunneling barrier layer in appropriate conditions. Such other combinations of suitable materials are within the scope of the present disclosure.

Figure 9:
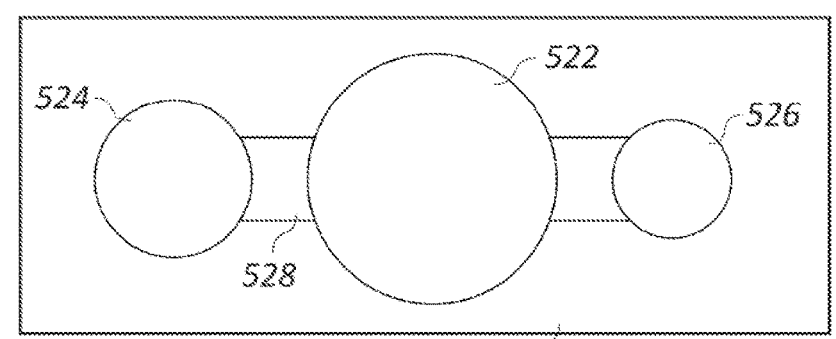
FIG. 9 is a diagrammatic top plan view of the memory device of FIG. 8, showing shapes and arrangement of elements of the memory device, according to one embodiment.
Figure 10:
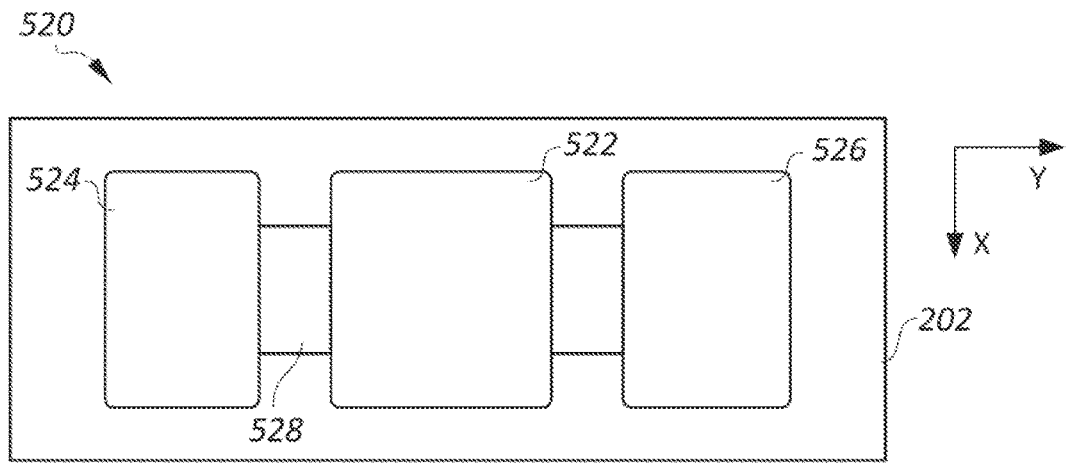
FIG. 10 is a diagrammatic top plan view of the memory device of FIG. 8, according to an alternate embodiment.

FIG. 9 is a diagrammatic top plan view of the memory device 520 of FIG. 8, showing the shapes and arrangement of the first, second, and third pinned ferromagnets 522, 524, 526, and the ferromagnetic free layer 528, according to one embodiment. FIG. 10 is a diagrammatic top plan view of the memory device 520 of FIG. 8, according to an alternate embodiment, in which the first, second, and third pinned ferromagnets 522, 524, 526 are rectangular in plan view, rather than circular. In some systems, it may be preferable for elements of the memory device to be rectangular, or some other shape, in order, for example, to be positioned more compactly in arrays, or to accommodate other design concerns. Embodiments that include these and other variations in shape and position of the elements of the device are therefore contemplated.

Figure 11:
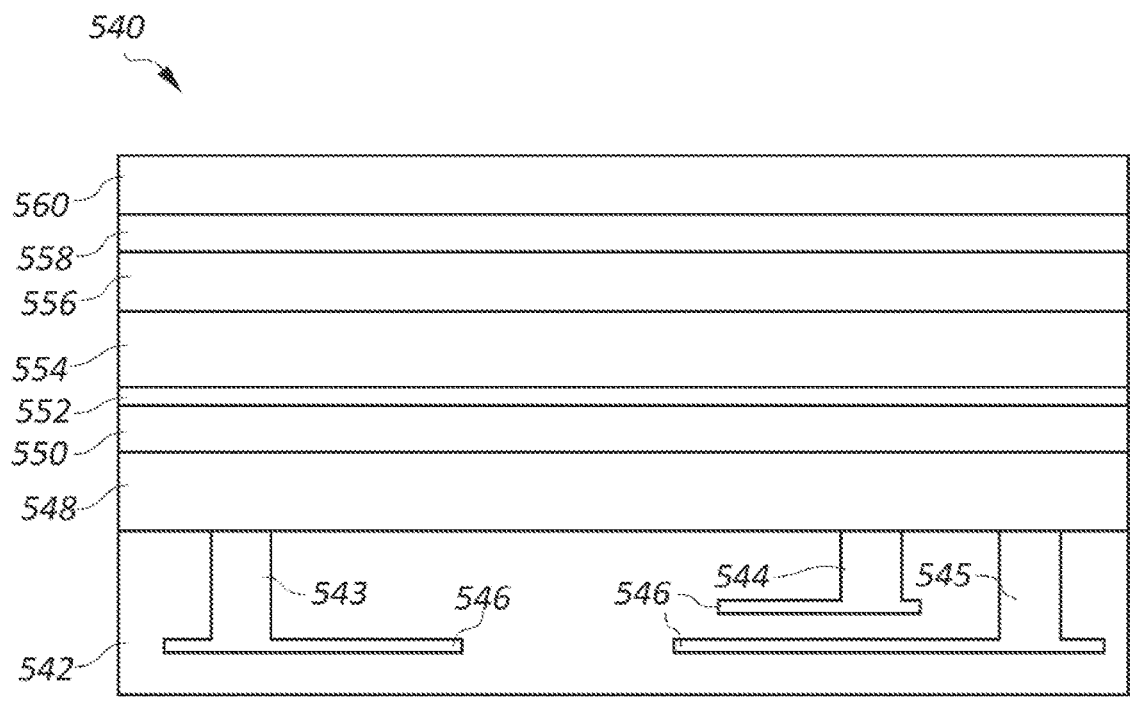
FIGS. 11-13 are side elevational diagrams of a semiconductor device that includes a spintronic memory device similar to the memory device of FIG. 8, at respective stages of a manufacturing process, according to an embodiment.
Figure 12:
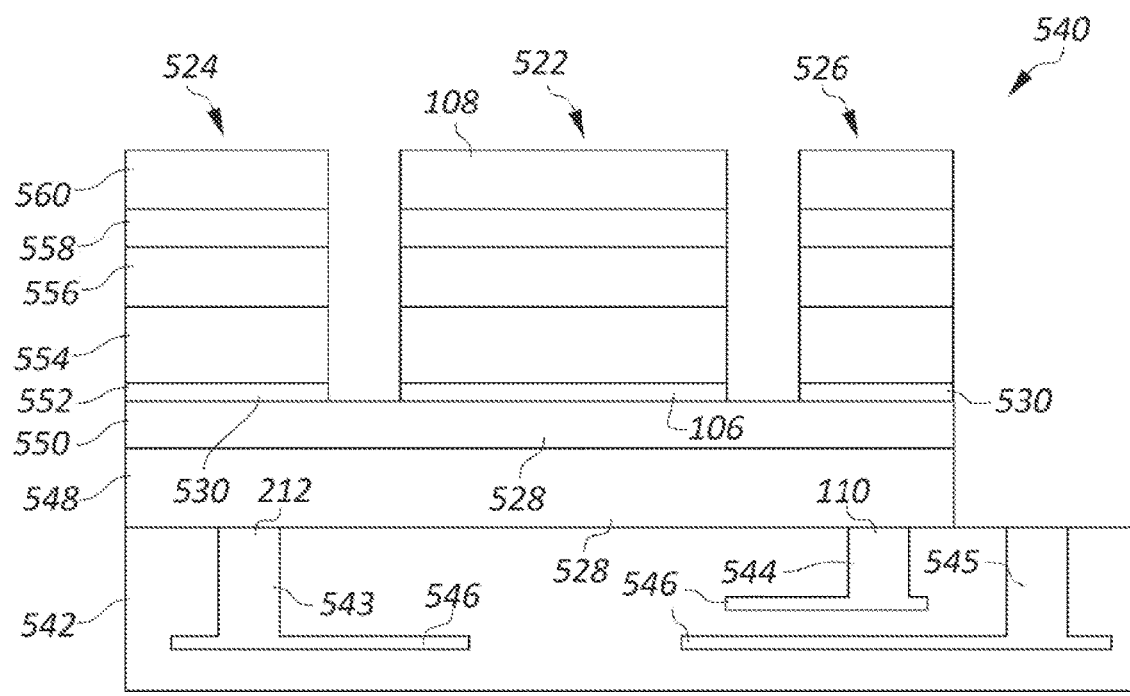
Figure 13:
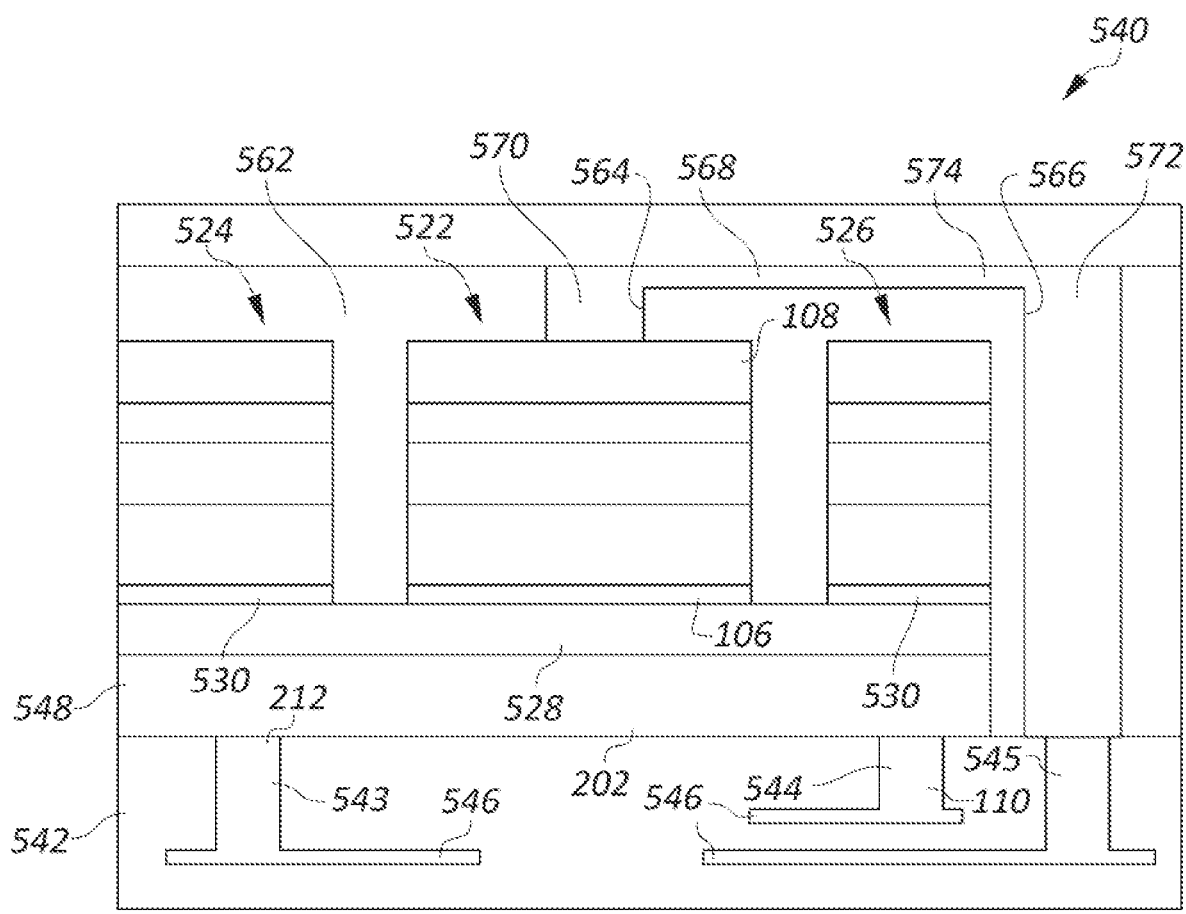

FIGS. 11-13 are side elevational diagrams of a semiconductor device 540 that includes a spintronic memory device similar to the memory device 520 described above, at respective stages of a manufacturing process, according to an embodiment. The semiconductor device includes a semiconductor material substrate 542 with active and passive electronic elements formed in a semiconductor base layer as well as additional semiconductor material, insulation material, and interconnections deposited thereon. Except for first, second, and third vias 543, 544, 545 that extend from metal interconnection layers 546 to an intermediate surface of the semiconductor material substrate 542, these and other elements formed in the semiconductor substrate 542 are not shown in detail here, inasmuch as they are made in accordance with known processing methods, and are not directly pertinent to the embodiments disclosed. Nevertheless, it will be understood that the wires of the interconnection layers 546 are electrically coupled to circuits formed in the substrate as required for proper operation of the semiconductor device 540.

Referring first to FIG. 11, following the formation in the semiconductor material substrate 542 of the various elements described above, various layers are deposited on the substrate. A heavy metal layer 548 is deposited on the substrate 542—in electrical contact with the first and second vias 543, 544, which will function as the read and ground terminals 212, 110. Then, in succession, a first layer of CoFeB magnetic material 550, a MgO layer 552, a second layer of CoFeB magnetic material 554, a layer of synthetic antiferromagnetic material 556, a capping layer 558, and an electrode layer 560 are each deposited. Next, as shown in FIG. 12, a first etch is performed to expose the first layer of CoFeB magnetic material 550, and to define, in the layers 552-560, the first, second, and third pinned ferromagnets 522, 524, 526—it will be understood that an etch includes the deposition and patterning of a resist layer prior to the actual etching process, as well as the subsequent removal of the remaining portions of the resist layer after the etching process, which processes are well known in the art. A second etch is then performed to expose the surface of the semiconductor material substrate 542, and to define thereon the write layer 202 and the ferromagnetic free layer 528. The third via 545 is also exposed at the surface of the semiconductor material substrate 542 by the second etch.

According to another embodiment, the first etch is performed to define, in the entire stack of layers, the shape of the heavy metal layer and the ferromagnetic free layer 528, after which the first, second, and third pinned ferromagnets 522, 524, 526 are defined in a second etch. In other embodiments, the heavy metal layer 548 is defined in a separate etch so as to extend beyond the ferromagnetic free layer 528 on one or more sides.

In the embodiment of FIGS. 11-13, each of the first, second, and third pinned ferromagnets 522, 524, 526 comprises a stack that includes respective portions of the MgO layer 552, the second layer of CoFeB magnetic material 554, the layer of synthetic antiferromagnetic material 556, the capping layer 558, and the electrode layer 560. The portion of the MgO layer 552 in the first pinned ferromagnet 522 acts as the tunneling barrier layer 106 between the ferromagnetic free layer 528 and the portion of the second layer of CoFeB magnetic material 554, and which together form the MTJ. The synthetic antiferromagnetic material 556 acts to protect and stabilize the magnetization of the underlying layer of CoFeB magnetic material 554, essentially acting as part of the pinning function, particularly in the case of the first pinned ferromagnet 522, which is regularly subjected to a read current. Examples of materials that are used as a synthetic antiferromagnetic material include, Co/Pt$_x$, Co/Ni$_x$, and other materials capable of stabilizing the magnetization of the underlying layer of magnetic material 554. The capping layer 558 acts as an electrically conductive passivation layer to prevent undesirable chemical or electrochemical interactions between the antiferromagnetic material 556 and the electrode layer 560, the material of which is selected to make a reliable electrical coupling with a read terminal connector that will be formed in a later step. Examples of materials that are used as a capping layer include Ru (ruthenium), Ta (tantalum) and other electrically conductive materials capable of preventing undesirable chemical or electrochemical interactions between the antiferromagnetic material and the electrode layer.

Of the stacks of layers that form the second and third pinned ferromagnets 524, 526, only the respective portions of the second layer of CoFeB magnetic material 554 are typically required, although others of the layers may provide benefits in some embodiments. However, even where some of the layers are not required, they do not generally impede the function of the device, and by forming all three ferromagnets from the same layers of material, the manufacturing process is considerably streamlined. Similarly, extending the ferromagnetic free layer 528 under the second and third pinned ferromagnets 524, 526 does not adversely affect the magnetic coupling between the pinned ferromagnets and the free layer, and eliminates the need to pattern the free layer prior to formation of the pinned ferromagnets.

Turning now to FIG. 13, a dielectric layer 562 is next deposited, and then etched to define a first opening 564 over the first ferromagnet 522 and a second opening 566 over the third via 545 at the surface of the substrate 542. A layer of conductive material 568, such as a metal, e.g., copper, aluminum, etc., is deposited over the dielectric layer 562 and patterned to form fourth and fifth vias 570, 572 connected by an interconnection 574, thereby electrically coupling the write terminal 108 with the third via 545.

Figure 14:
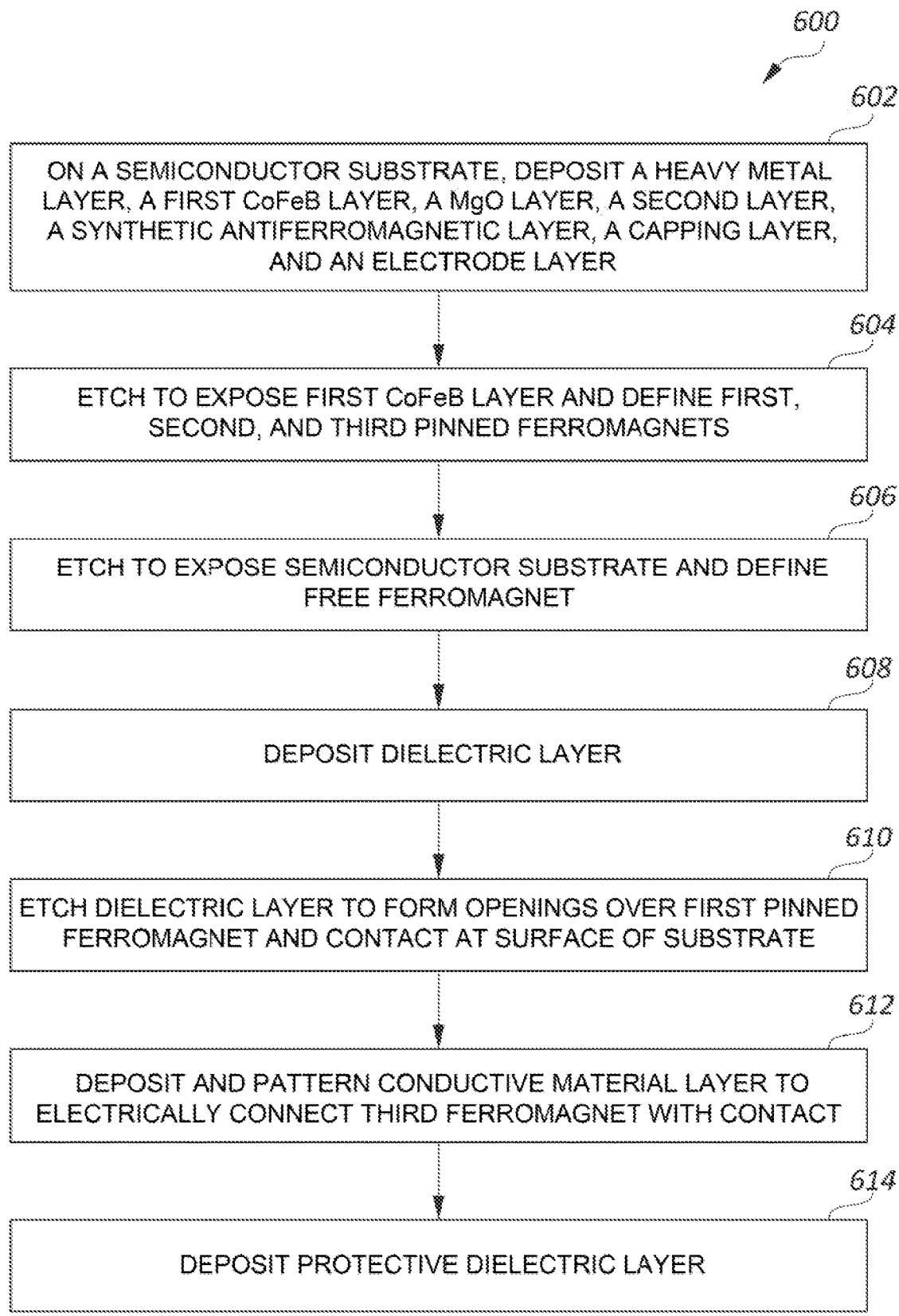
FIG. 14 is a flow chart outlining a method of manufacture, according to an embodiment.

FIG. 14 is a flow chart outlining a method of manufacture 600, according to an embodiment. In step 602, a stack of layers is deposited on a semiconductor substrate, the stack including a heavy metal layer, a first CoFeB layer, a MgO layer, a second CoFeB layer, an antiferromagnetic layer, a capping layer, and an electrode layer. Next, the stack is etched to expose the first CoFeB layer and define first, second, and third pinned ferromagnets, in step 604. In step 606, a second etch is performed to expose the surface of the semiconductor substrate and define a free ferromagnet. Then, in step 608, a layer of dielectric material is deposited, and, in step 610, etched, to form openings over the first pinned ferromagnet and to expose an electrical contact at the surface of the substrate. In step 612, a layer of conductive material is deposited and patterned to electrically connect the third pinned ferromagnet with the contact at the surface of the substrate. In step 614, a protective layer of dielectric material is deposited over the device.

Figure 15:
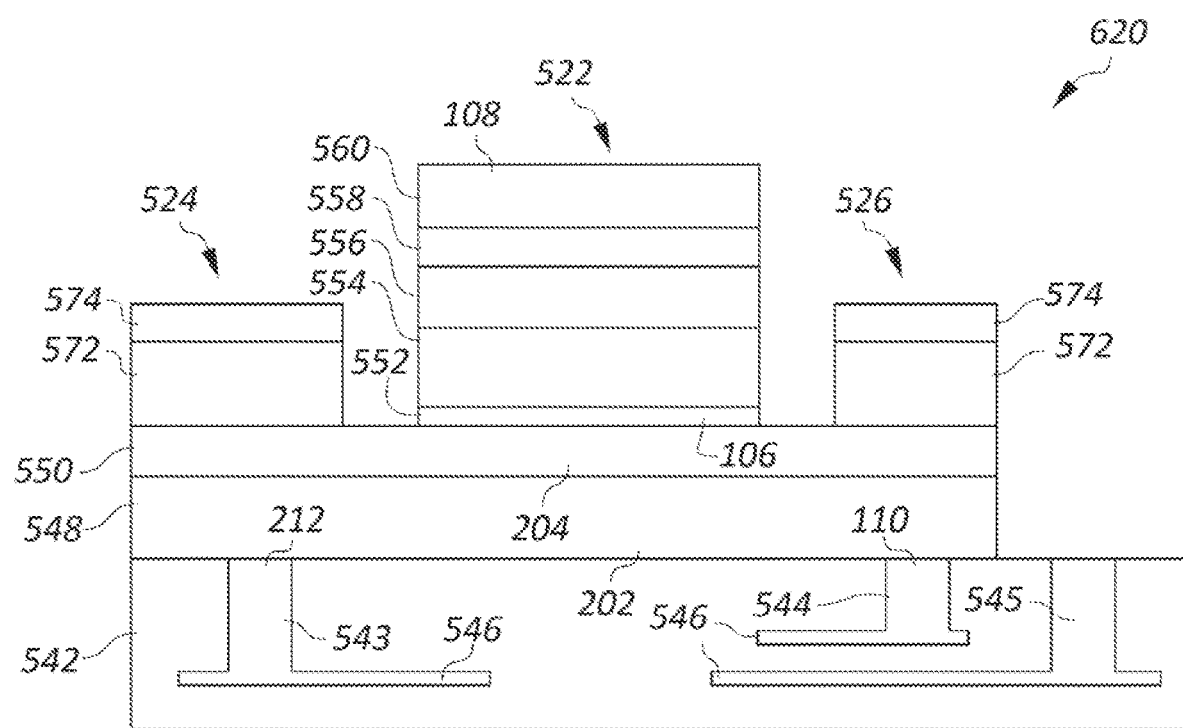
FIG. 15 is a side elevational diagram of a semiconductor device, according to an embodiment, that includes a spintronic memory device similar to the memory device of FIG. 8, at a stage of a manufacturing process that corresponds to the stage shown in FIG. 13.

FIG. 15 is a side elevational diagram of a semiconductor device 620, according to an embodiment, that includes a spintronic memory device similar to the memory device 520 described above, and at a stage of a manufacturing process that corresponds to the stage shown in FIG. 13. The manufacturing process of the semiconductor device 620 is similar to that described with reference to FIGS. 11-13 and the process flow of FIG. 14, with a few exceptions. First, the first etch is used to define only the first ferromagnet 522. Then an additional CoFeB layer 672 and an additional capping layer 674 are deposited, after which an etch is performed to define the second and third ferromagnets 524, 526. From this point, the process proceeds as described with reference to FIGS. 11-14, continuing from the deposition of the dielectric layer 562, as described with reference to FIG. 13.

The process of FIG. 15 includes additional process steps, compared to the process of FIGS. 11-14. However, in the device 620, extraneous layers of the second and third ferromagnets 524, 526 are omitted, as compared to the device 540 of FIGS. 11-13. This may be beneficial, for example, in embodiments in which those extraneous elements produce some undesirable effect.

Figure 16:
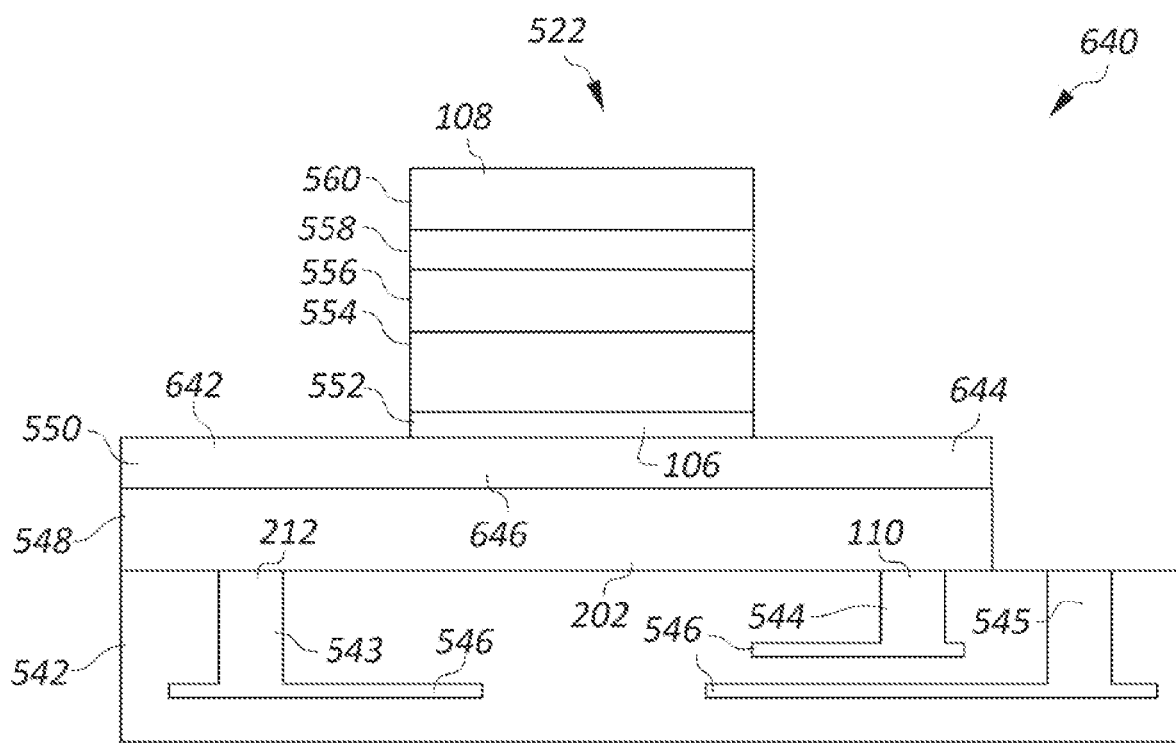
FIG. 16 is a side elevational diagram of a semiconductor device, according to an embodiment, that includes a spintronic memory device similar to the memory device of FIG. 8, at a stage of a manufacturing process that corresponds to the stage shown in FIG. 13.
Figure 17:
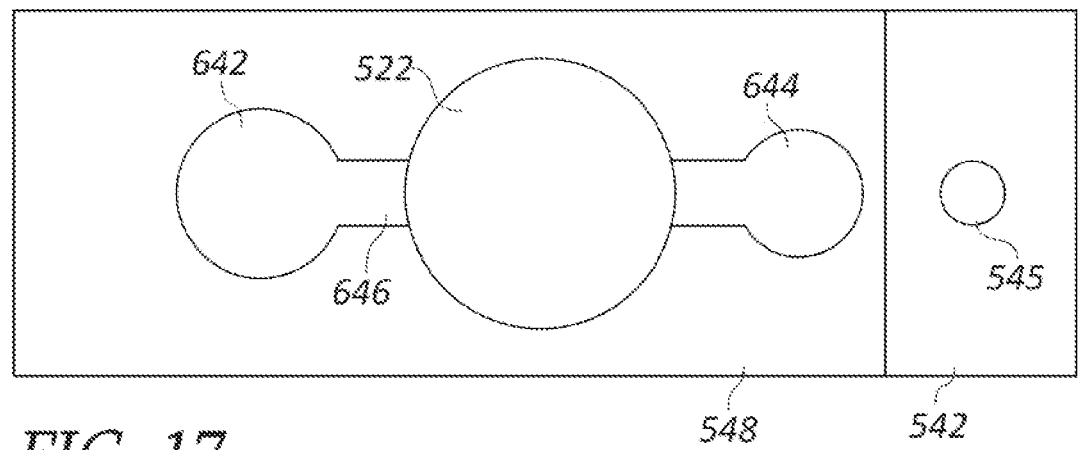
FIG. 17 is a top plan view of the semiconductor device of FIG. 16 at the same stage of manufacture, according to an embodiment.

FIG. 16 is a side elevational diagram of a semiconductor device 640, according to an embodiment, that includes a spintronic memory device similar to the memory device 520 described above, at a stage of a manufacturing process that corresponds to the stage shown in FIG. 13. FIG. 17 is a top plan view of the semiconductor device 640 at the stage of manufacture shown in FIG. 16. The manufacturing process of the semiconductor device 640 is again similar to that described with reference to FIGS. 11-13 and the process flow of FIG. 14, except as explained hereafter. First, the first layer of CoFeB magnetic material 550 is etched to define regions that will function as first and second ferromagnets 642, 644 and a free ferromagnetic strip 646 extending between them, prior to the deposition of the remaining layers in the stack. The remaining layers are deposited and etched to define the first pinned ferromagnet 522, and the process continues thereafter as described with reference to FIGS. 11-14. Coercivities of the first and second ferromagnets 642, 644 are controlled by selection of the shape of the portion of the first layer of CoFeB magnetic material 550 that remains after the first etch, as shown, for example, in FIG. 17. The first and second ferromagnets 642, 644 are defined by enlarged regions at each end of the free ferromagnetic strip 646, which modify the effective aspect ratio of those portions.

It will be noted that in the various memory devices shown and described above (400, 520, 540, etc.), of the three pinned ferromagnets, the ferromagnet in the center is shown with a coercivity that is lower than that of either of the others, while the ferromagnet on the right is shown having the highest coercivity. Additionally, the polarities of the various ferromagnets is shown in each embodiment as being the same as the polarities of corresponding magnets of other embodiments. This is done for simplicity and clarity, but is not intended to limit the claims in any way. Embodiments are also contemplated that include various other configurations. For example, according to an embodiment, the diameter, and therefore the aspect ratio of at least one of the pinned ferromagnets is selected to provide specific conduction characteristics during a read cycle of the memory device. Accordingly, the size, aspect ratio, and/or coercivity of that magnet may be, out of necessity or convenience, greater, equal to, or less than that of one or both of the other ferromagnets, depending upon the desired operating characteristics of the device.

According to the principles disclosed, first and second pinned or otherwise fixed anchor magnets with antiparallel polarities are positioned at or near respective ends of a free magnetic element, acting to stabilize a domain wall of the free magnet. The specific polarities of the anchor magnets is a design consideration. A pinned read magnet is positioned over the free magnet and separated therefrom by a tunneling barrier material—typically an oxide—so as to form, with the tunneling barrier and the free magnet, a magnetic tunnel junction. The specific polarity of the read magnet is also a design consideration. Preferably, the polarities of the read magnet and of one of the anchor magnets are substantially parallel with each other and antiparallel to the other of the anchor magnets.

The magnetization methods described above, particularly with reference to FIGS. 4 and 5, can be adapted to accommodate any ordering of coercivities and/or desired relative polarities of the magnets. For example, given two anchor magnets and one read magnet, at least one of the anchor magnets will have a coercivity that is either higher or lower than both of the other magnets. The strength of the second magnetic field employed in the magnetizing process is simply selected to fall between the values of coercivity of that magnet and the other two. Preferably, the coercivity of one of the anchor magnets is selected to be significantly higher or lower than the coercivities of the other two magnets, in order to reduce the degree of demagnetization of the stronger one or two of the magnets during exposure to the second magnetizing field.

The embodiments described in the present disclosure illustrate several beneficial principles. For example, one or more ferromagnets can be magnetized at one polarity without changing the magnetic polarity of another one or more antiparallel ferromagnets by controlling the coercivities of the various magnets. This is of particular value in situations where it impractical to isolate the magnets that are to be of one polarity from those of another polarity. Coercivity can be controlled by selecting the shape, and in particular the aspect ratio of the respective ferromagnets. This is beneficial in the manufacture of microelectronic devices, inasmuch as it enables formation of large quantities of magnetic structures on semiconductor substrates using well known and understood processes, and controlling their respective coercivities as a function of shape, rather than composition. This reduces complexity and cost. Several methods are disclosed, for the manufacture of devices that include ferromagnets whose coercivities are controlled by selection of their aspect ratios. Other methods are disclosed for magnetizing antiparallel magnets.

According to an embodiment, a device is provided that includes a semiconductor substrate, a free magnetic element on the semiconductor substrate and having first and second magnetic domains separated by a domain wall, a first magnet positioned on the substrate near a first end of the free magnetic element and having a first polarity and a first value of coercivity, and a second magnet positioned on the substrate near a second end of the free magnetic element and having a second polarity, antiparallel with respect to the first polarity, and a second value of coercivity, different from the first value of coercivity.

According to an embodiment, a method is provided, which includes magnetically saturating, at a first polarity, first and second magnetic elements that are positioned together on a substrate by exposing the first and second magnetic elements to a first magnetic field that has a first flux density, then remagnetizing the first magnetic element at a second magnetic polarity antiparallel to the first polarity without changing the polarity of the second magnetic element by exposing the first and second magnetic elements to a second magnetic field that has a second flux density, less than the first flux density.

According to another embodiment, a method of manufacture is provided, that includes forming a free magnetic element on a semiconductor substrate, forming a first magnet, with a first value of coercivity, on the substrate near a first end of the free magnetic element, and forming a second magnet, with a second value of coercivity different from the first value of coercivity, on the substrate near a second end of the free magnetic element.

The methods described above include processes that are not described in detail, but that are common in the manufacture of semiconductor devices. For example, in deposition of a number of layers of various compositions is described. It is understood that "depositing" some types of material typically involves a vapor deposition process, while for other types, a sputter deposition is more common. In other cases, depositing a layer may require forming an oxide over an existing layer, or depositing another material, then forming the oxide. In other steps, an etch is referred to, which will be understood as including the deposition and patterning of a resist layer, then, after the etch itself is complete, removing the remaining resist. It is easily within the abilities of a person having ordinary skill in the art to select and perform all of the appropriate process steps that are implicit in the method steps outlined above.

Ordinal numbers, e.g., first, second, third, etc., are used in the claims according to conventional claim practice, i.e., for the purpose of clearly distinguishing between claimed elements or features thereof, etc. Ordinal numbers may be—though not necessarily—assigned simply in the order in which elements are introduced. The use of such numbers does not suggest any other relationship, such as, order of operation, relative position of such elements, etc. Furthermore, an ordinal number used to refer to an element in a claim should not be assumed to correlate to a number used in the specification to refer to an element of a disclosed embodiment on which that claim reads, nor to numbers used in unrelated claims to designate similar elements or features.

The abstract of the present disclosure is provided as a brief outline of some of the principles of the invention according to one embodiment, but is not intended as a complete or definitive description of any single embodiment thereof, nor should it be relied upon to define terms used in the specification or claims. The abstract does not limit the scope of the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
forming a free magnetic element on a semiconductor substrate;
forming a first pinned magnet on the substrate adjacent to a first end of the free magnetic element and having a first polarity and a first value of coercivity; and
forming a second pinned magnet on the substrate adjacent to a second end of the free magnetic element and having a second polarity, antiparallel relative to the first polarity, and having a second value of coercivity, different from the first value of coercivity,
wherein the first and second pinned magnets are made of a same material, have a same thickness, and have aspect ratios that are different from each other.

2. The method of claim 1, further comprising:
forming a tunneling barrier layer on the free magnetic layer;
forming a third magnet on the tunneling barrier layer, and
configuring the third magnet, the free magnetic element, and the tunneling barrier layer such that an electric current passing through the tunneling barrier layer between the third magnet and the free magnetic element is limited by a tunnel magneto resistance whose ohmic value is determined by a position of a domain wall within the free magnetic element.

3. The method of claim 2, comprising:
forming a write element positioned on the substrate on a side of the free magnetic element opposite the third magnet.

4. The method of claim 3, wherein the write element is positioned on the substrate and between the substrate and the free magnetic element, and the free magnetic element is positioned, at least in part, between the write element and the third magnet.

5. The method of claim 2, comprising applying an electric current passing with a first polarity through a write element to move the domain wall away from the first pinned magnet and toward the second pinned magnet.

6. The method of claim 2, comprising applying an electric current passing with a second polarity, opposite a first polarity, through a write element to move the domain wall away from the second pinned magnet and toward the first pinned magnet.

7. The method of claim 1, wherein the first and second pinned magnets are made of a compound including cobalt, iron, and boron.

8. The method of claim 1 wherein the first value of coercivity is in a range between 500 Oe and 1000 Oe, and the second value of coercivity is in a range between 1500 Oe and 3000 Oe.

9. A method, comprising:
forming, over a semiconductor substrate, a free magnetic element;
forming a first pinned magnet over the free magnetic element, the first pinned magnet having a first value of coercivity; and
forming a second pinned magnet over the free magnetic element, the second pinned magnet having a second value of coercivity different from the first value of coercivity.

10. The method of claim 9 wherein:
forming the first pinned magnet includes forming the first pinned magnet with a first polarity; and
forming the second pinned magnet includes forming the second pinned magnet with a second polarity, antiparallel with respect to the first polarity.

11. The method of claim 9, comprising:
forming a third magnet over the substrate adjacent to the free magnetic element; and
forming a tunneling barrier layer between the free magnetic element and the third magnet.

12. The method of claim 11 wherein the forming the free magnetic element, the forming the first pinned magnet, the forming the second pinned magnet, the forming the third magnet and the forming the tunneling barrier layer together comprise:
depositing a first CoFeB layer on the semiconductor substrate;

depositing a MgO layer over the first CoFeB layer;
depositing a second CoFeB layer;
depositing an electrode layer;
defining the third magnet to include a portion of each of the second CoFeB layer and the electrode layer;
defining the tunneling barrier layer to include a portion of the MgO layer; and
defining the free magnetic element to include a portion of the first CoFeB layer.

13. The method of claim 12 wherein:
the defining the third magnet and the defining the tunneling barrier layer together comprise performing a first etch that defines the third magnet and the tunneling barrier layer in a first stack; and
the defining the free magnetic element comprises performing a second etch that defines the free magnetic element in the first CoFeB layer, with the first stack positioned thereon.

14. The method of claim 13 wherein the forming the first pinned magnet and the forming the second pinned magnet together comprise defining the first and second pinned magnets and include performing the first etch, which defines the first and second pinned magnets in second and third stacks, respectively, each of the second and third stacks being positioned on the free magnetic element and including respective portions of the MgO layer, the second CoFeB layer, and the electrode layer.

15. The method of claim 14 wherein the forming the first pinned magnet and the forming the second pinned magnet together comprise:
depositing a third CoFeB layer over the free magnetic element; and
defining the first and second pinned magnets, including performing a third etch that defines the first and second pinned magnets in second and third stacks, respectively, each of the second and third stacks being positioned on the free magnetic element and including respective portions of the third CoFeB layer.

16. The method of claim 13 wherein the forming the first pinned magnet and the forming the second pinned magnet together comprise:
performing the second etch which includes defining the first and second pinned magnets in the first CoFeB layer with the free magnetic element.

17. The method of claim 12, further comprising:
depositing a heavy metal layer between the semiconductor substrate and the first CoFeB layer;
depositing an antiferromagnetic layer between the second CoFeB layer and the electrode layer; and
depositing a capping layer between the antiferromagnetic layer and the electrode layer.

* * * * *